(12) United States Patent
Hsu et al.

(10) Patent No.: US 12,349,602 B2
(45) Date of Patent: Jul. 1, 2025

(54) BOTTOM ELECTRODE VIA AND CONDUCTIVE BARRIER DESIGN TO ELIMINATE ELECTRICAL SHORT IN MEMORY DEVICES

(71) Applicant: Taiwan Semiconductor Manufacturing Company, Ltd., Hsinchu (TW)

(72) Inventors: Chern-Yow Hsu, Chu-Bei (TW); Shih-Chang Liu, Alian Township (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/359,289

(22) Filed: Jul. 26, 2023

(65) Prior Publication Data
US 2023/0371397 A1    Nov. 16, 2023

Related U.S. Application Data

(62) Division of application No. 17/245,221, filed on Apr. 30, 2021.

(51) Int. Cl.
*H10N 50/80* (2023.01)
*H10N 50/01* (2023.01)
*H10N 50/10* (2023.01)

(52) U.S. Cl.
CPC .............. *H10N 50/80* (2023.02); *H10N 50/01* (2023.02); *H10N 50/10* (2023.02)

(58) Field of Classification Search
CPC ........ H10N 50/80; H10N 50/01; H10N 50/10; H10B 61/00; H10B 61/22
USPC .......................................................... 257/421
See application file for complete search history.

(56) References Cited

U.S. PATENT DOCUMENTS

| | | |
|---|---|---|
| 2013/0029431 A1 | 1/2013 | Takahashi et al. |
| 2017/0053967 A1* | 2/2017 | Chuang ................. H10N 50/01 |
| 2017/0069684 A1 | 3/2017 | Suh et al. |
| 2019/0027537 A1 | 1/2019 | Wiegand et al. |
| 2019/0067559 A1* | 2/2019 | Chang .................... H10N 50/10 |
| 2019/0074440 A1 | 3/2019 | Yang et al. |
| 2020/0006638 A1 | 1/2020 | Chen et al. |
| 2020/0106007 A1 | 4/2020 | Peng et al. |

(Continued)

OTHER PUBLICATIONS

Non-Final Office Action dated Jul. 6, 2023 for U.S. Appl. No. 17/245,221.

(Continued)

*Primary Examiner* — Jami Valentine Miller
*Assistant Examiner* — Zhijun Xu
(74) *Attorney, Agent, or Firm* — Eschweiler & Potashnik, LLC

(57) ABSTRACT

In some embodiments, the present disclosure relates to an integrated chip (IC), including a bottom electrode overlying an interconnect structure disposed within a lower inter-level dielectric (ILD) layer, a top electrode over the bottom electrode, a data storage structure between the top electrode from the bottom electrode, a conductive barrier layer overlying the interconnect structure, and a bottom electrode via (BEVA) vertically separating and contacting a bottom surface of the bottom electrode and a top surface of the conductive barrier layer. A maximum width of the BEVA is less than a width of the data storage structure.

20 Claims, 14 Drawing Sheets

(56) References Cited

U.S. PATENT DOCUMENTS

2020/0144178 A1* 5/2020 Patlolla ............... H01L 23/5329
2020/0365795 A1 11/2020 Chuang et al.
2021/0005807 A1 1/2021 Kwon
2021/0134668 A1* 5/2021 Huang ................... H10B 61/22

OTHER PUBLICATIONS

Final Office Action dated Dec. 20, 2023 for U.S. Appl. No. 17/245,221.
Non-Final Office Action dated Jun. 20, 2024, or U.S. Appl. No. 17/245,221.
Final Office Action dated Dec. 23, 2024, for U.S. Appl. No. 17/245,221.

* cited by examiner

BOTTOM ELECTRODE VIA AND CONDUCTIVE BARRIER DESIGN TO ELIMINATE ELECTRICAL SHORT IN MEMORY DEVICES

REFERENCE TO RELATED APPLICATION

This Application is a Divisional of U.S. application Ser. No. 17/245,221, filed on Apr. 30, 2021, the contents of which are hereby incorporated by reference in their entirety.

BACKGROUND

Many modern-day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Electronic memory can comprise data storage structures such as magnetic tunnel junctions (MTJs), which can be used in hard disk drives and/or RAM, and may be promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
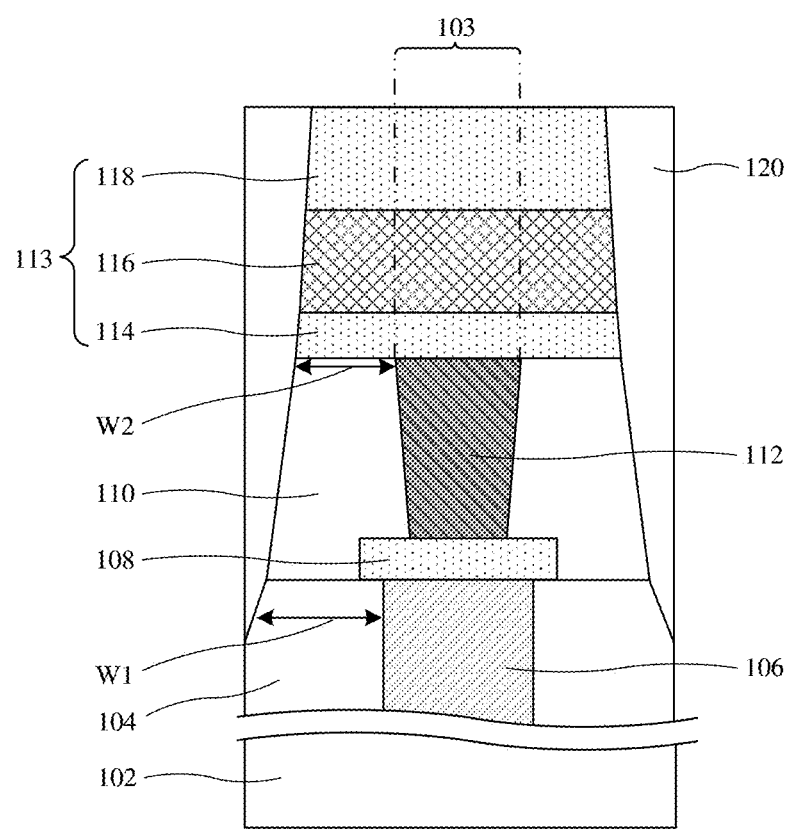
FIG. 1 illustrates a cross-sectional view of some embodiments of an integrated chip (IC) comprising a bottom electrode via (BEVA) having a narrow width that is configured to reduce shorting due to re-deposition of a conductive material during manufacturing.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A memory device includes a data storage structure arranged between top and bottom electrodes. The data storage structure is able to store a bit of information as a logical "1" or a logical "0". By applying an electrical bias to the memory device and across the data storage structure, the bit may be switched from a logical "0" to a logical "1" and vice versa. A bottom electrode via (BEVA) electrically couples a metal interconnect to the bottom electrode, such that an electrical bias can be applied.

A memory device may be formed by forming a BEVA over a metal interconnect. Then a bottom electrode may be formed over the BEVA, a data storage structure may be formed over the bottom electrode, and a top electrode may be formed over the data storage structure. A hard mask structure may then be deposited over the top electrode. The top electrode may undergo a first etch according to the hard mask structure. Then, the top electrode may be used as a mask for a second etch of the data storage structure and the bottom electrode.

The BEVA may be designed to be wider than the data storage structure to minimize via resistance. By minimizing via resistance, power consumption is also minimized, thus increasing the efficiency of the memory device. However, if the BEVA, and/or the metal interconnect are wider than the data storage structure, in many cases, the second etch may etch away a portion of the BEVA, and/or the metal interconnect. In doing so, the second etch may cause metallic by-product from the BEVA, and/or the metal interconnect to be re-deposited on sidewalls of the data storage structure. The re-deposited metallic by-product may result in the memory device being electrically shorted, which impacts a reliability of the memory device to read, write, and store bits of information. In some cases, an electrical short can render the memory device useless.

In the present disclosure, a method of manufacturing memory devices is presented to produce reliable memory devices. The new manufacturing method makes the BEVA narrower. To compensate for an increase in resistance due to making the BEVA narrower, using a low resistivity metal is disposed between a bottom of the BEVA and an underlying metal interconnect. The low resistivity metal shortens a height of the BEVA, and thereby compensating for the increase in resistance. By narrowing the BEVA and the metal interconnect, the new manufacturing method ensures that during the second etch of the data storage structure, no metallic by-product from the BEVA and/or the metal interconnect is re-deposited on sidewalls of the data storage structure, and thus prevents the memory device from being electrically shorted. In doing so, the memory device may reliably read, write, and store bits of information.

FIG. 1 illustrates a cross-sectional view 100 of some embodiments of an integrated chip (IC) comprising a bottom electrode via (BEVA) having a narrow width that is configured to reduce shorting due to re-deposition of a conductive material during manufacturing.

The IC comprises a lower inter-layer dielectric (ILD) layer 104 disposed over a semiconductor substrate 102. The ILD layer 104 comprises an interconnect structure 106, and a conductive barrier layer 108 overlies the interconnect structure 106. In some embodiments, the conductive barrier layer 108 comprises a lower surface that laterally extends past outer sidewalls of the interconnect structure 106. A dielectric layer 110 overlies the conductive barrier layer 108. In some embodiments, the dielectric layer 110 surrounds outer sidewalls of the conductive barrier layer 108. The conductive barrier layer 108 electrically couples the interconnect structure 106 to a bottom electrode via (BEVA) 112. The BEVA 112 extends through an opening 103 defined by inner sidewalls of the dielectric layer 110 and electrically couples the conductive barrier layer 108 to a memory device 113.

In some embodiments, the memory device 113 may comprise a bottom electrode 114 disposed over the BEVA 112, and a top electrode 118 over the bottom electrode 114. A data storage structure 116 is disposed between the bottom electrode 114 and the top electrode 118. The data storage structure 116 is configured to store a bit of data. In some embodiments, a dielectric structure 120 surrounds outer sidewalls of the top electrode 118, the bottom electrode 114, and the data storage structure 116. In some embodiments, the dielectric structure 120 extends to vertically below a bottom surface of the dielectric layer 110. In some embodiments, the data storage structure 116 may be or otherwise comprise, for example, a magnetic tunnel junction (MTJ), a ferroelectric layer, or any other suitable data storage structure(s).

The ILD layer 104 laterally extends to non-zero distances past opposing sides of the interconnect structure 106. By extending past opposing sides of the interconnect structure 106, the ILD layer 104 is able to prevent the exposure of the interconnect structure 106 during etching processes used to manufacture the memory device 113. In some embodiments, the ILD layer 104 may have a first width W1 that extends from an outer sidewall of the ILD layer 104 to an outer sidewall of the interconnect structure 106. In some embodiments, the first width W1 may range from approximately 5 nm to approximately 50 nm, from approximately 5 nanometers to approximately 30 nanometers, from approximately 10 nm to approximately 20 nm, or other similar values. Similarly, the dielectric layer 110 laterally extends to non-zero distances past opposing sides of the BEVA 112. By extending past opposing sides of the BEVA 112, the dielectric layer 110 is able to prevent the exposure of the BEVA 112 during etching processes used to manufacture the memory device 113. In some embodiments, the dielectric layer 110 has a second width W2 at a top surface of the dielectric layer 110 that extends from an outer sidewall of the dielectric layer 110 to an outer sidewall of the BEVA 112. In some embodiments, the second width W2 may range from approximately 1 nm to approximately 20 nm, from approximately 2 nanometers to approximately 15 nanometers, from approximately 5 nm to approximately 10 nm, or other similar values. In some embodiments, a bottommost surface of the bottom electrode 114 continuously extends past opposing outermost sidewalls of the BEVA 112.

By implementing a non-zero lateral distance between the BEVA 112 and the outer sidewalls of the dielectric layer 110, between the conductive barrier layer 108 and the outer sidewalls of the dielectric layer 110, and between the interconnect structure 106 and outer sidewalls of the ILD layer 104, the IC ensures that during an etch of the data storage structure 116, no metallic by-product from the BEVA 112, the conductive barrier layer 108, and/or the interconnect structure 106 is re-deposited on sidewalls of the data storage structure.

Figure 2:
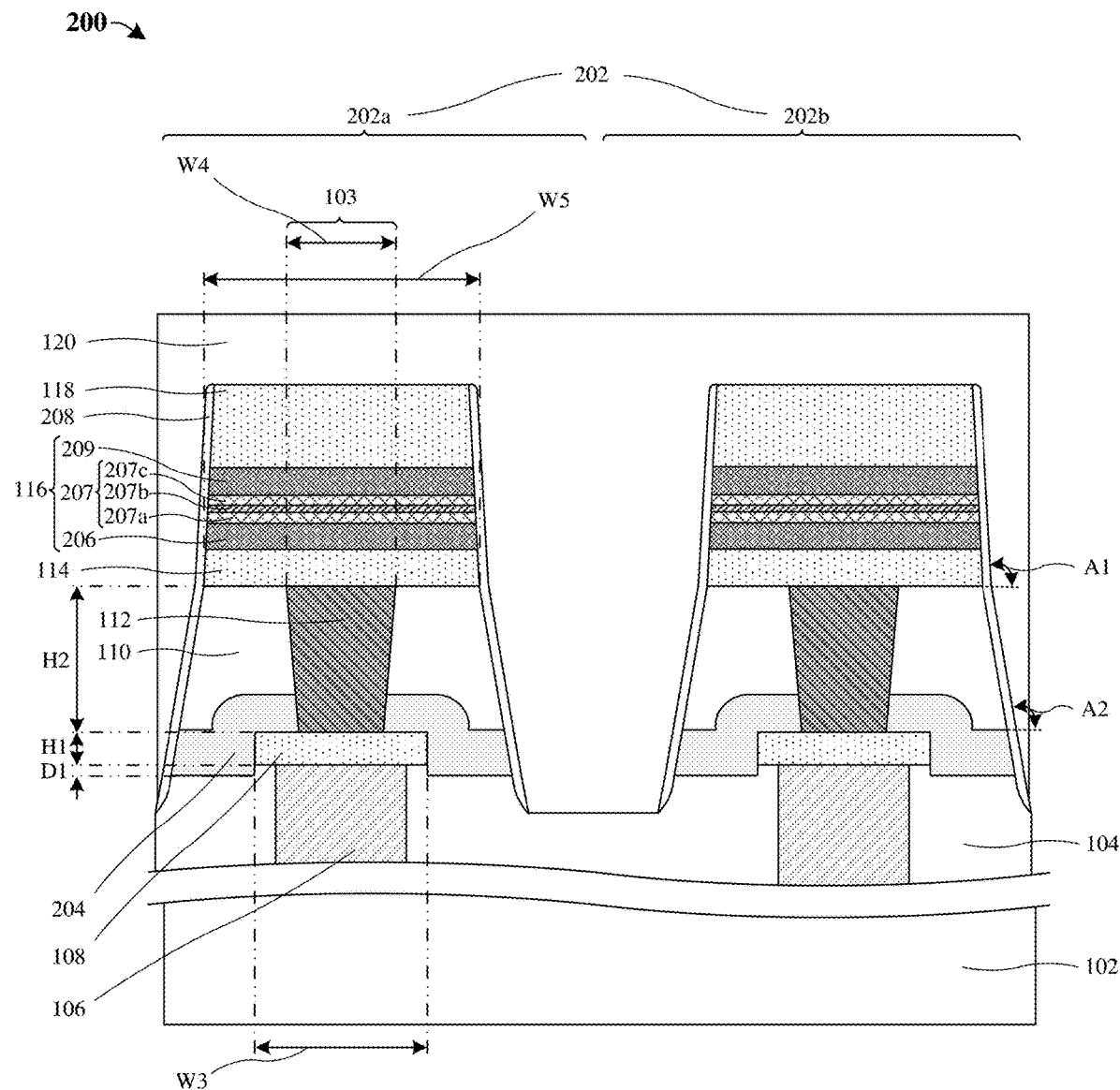
FIG. 2 illustrates a cross-sectional view of some embodiments of an integrated chip (IC) comprising a plurality of memory regions with a bottom electrode via (BEVA) having a narrow width that is configured to reduce shorting due to re-deposition of a conductive material during manufacturing.

FIG. 2 illustrates a cross-sectional view 200 of some embodiments of an integrated chip (IC) comprising a plurality of memory regions with a bottom electrode via (BEVA) having a narrow width that is configured to reduce shorting due to re-deposition of a conductive material during manufacturing.

The IC comprises a lower inter-layer dielectric (ILD) layer 104 disposed over a semiconductor substrate 102. A plurality of memory regions 202 overlie the ILD layer 104. The plurality of memory regions 202 comprise a first memory region 202a and a second memory region 202b. In some embodiments, the plurality of memory regions 202 may comprise additional memory regions. The plurality of memory regions 202 respectively comprise an interconnect structure 106 disposed within the ILD layer 104, and a conductive barrier layer 108 overlying the interconnect structure 106. An etch stop layer 204 overlies the conductive barrier layers 108. In some embodiments, the etch stop layer 204 surrounds outer sidewalls of the conductive barrier layer 108.

A dielectric layer 110 is disposed over the etch stop layer 204. A bottom electrode via (BEVA) 112 extends through an opening 103 defined by inner sidewalls of the dielectric layer 110 and inner sidewalls of the etch stop layer 204. A bottom electrode 114 overlies the BEVA 112 and the dielectric layer 110. A top electrode 118 overlies the bottom electrode 114, and a data storage structure 116 is disposed between the bottom electrode 114 and the top electrode 118. The data storage structure 116 is configured to store a bit of data. In some embodiments, a bit of data may be written to the data storage structure 116 by providing an electrical bias across the data storage structure 116.

In some embodiments, the data storage structure 116 comprises a magnetic tunnel junction (MTJ) 207 that comprises a pinned ferromagnetic layer 207a underlying and separated from a free ferromagnetic layer 207c by a tunnel dielectric layer 207b. The pinned ferromagnetic layer 207a has a fixed magnetization direction, and the free ferromagnetic layer 207c has a dynamic magnetization direction. In further embodiments, the data storage structure 116 further comprises a seed layer 206 underlying the MTJ 207 and separating the MTJ 207 from the bottom electrode 114. The seed layer 206 may promote crystalline growth of the MTJ 207. In further embodiments, the data storage structure 116 further comprises an encapsulation layer 209 overlying the MTJ 207 and separating the MTJ 207 from the top electrode 118. The encapsulation layer 209 protects the MTJ 207 from exposure to gas and/or moisture. The encapsulation layer 209 further prevents metal from diffusing into the MTJ 207.

In some embodiments wherein the data storage structure 116 comprises the MTJ 207, the dynamic magnetization direction of the free ferromagnetic layer 207c can be switched by applying an electrical bias across the tunnel dielectric layer 207b. By applying a current in a first direction from the free ferromagnetic layer 207c to the pinned ferromagnetic layer 207a, electrons with a magnetization direction the same as that of the pinned ferromagnetic layer 207a flow into and accumulate in the free ferromagnetic layer 207c, causing the magnetization of the free ferromagnetic layer 207c to be parallel to the pinned ferromagnetic layer 207a, writing the MTJ 207 to a low resistance state, representing the bit of data as a logical '0'. By applying a current in a second direction from the pinned ferromagnetic layer 207a to the free ferromagnetic layer 207c, electrons with a magnetization direction opposite that of the pinned ferromagnetic layer 207a flow into and accumulate in the free ferromagnetic layer 207c, causing the magnetization of the free ferromagnetic layer 207c to be antiparallel to the pinned ferromagnetic layer 207a, writing the MTJ 207 to a high resistance state, representing the bit of data as a logical '1'. By measuring the resistance across the MTJ 207, this bit of data can be read.

In some embodiments, a dielectric structure 120 surrounds outer sidewalls of the top electrode 118, the bottom electrode 114, and the data storage structure 116. In some embodiments, the dielectric structure 120 continuously extends over the first memory region 202a and the second memory region 202b. A sidewall spacer 208 is disposed along opposing sidewalls of the data storage structure 116. In some embodiments, the sidewall spacer 208 continuously extends from a top surface of the top electrode 118 to the ILD layer 104, such that the sidewall spacer 208 is disposed along opposing sidewalls of the dielectric layer 110.

In some embodiments, the conductive barrier layer 108 has a third width W3. In some embodiments, the third width W3 may range from approximately 30 nanometers to approximately 80 nanometers, from approximately 20 nanometers to approximately 100 nanometers, or other similar values. The BEVA 112 and the corresponding opening 103 respectively have a fourth width W4. In some embodiments, the fourth width W4 of the BEVA 112 is measured at a top surface of the BEVA 112. In some embodiments the third width W3 of the conductive barrier layer 108 is greater than the fourth width W4. In some embodiments, the fourth width W4 is a maximum width of the BEVA 112 and the corresponding opening 103. In some embodiments, the fourth width W4 may range from approximately 30 nanometers to approximately 80 nanometers, from approximately 20 nanometers to approximately 100 nanometers, or other similar values. The bottom electrode 114 has a fifth width W5. In some embodiments, the fifth width W5 of the bottom electrode 114 may be greater than a maximum width of the data storage structure 116 and the top electrode 118. In some embodiments, the fifth width W5 of the bottom electrode 114 is measured at a bottom surface of the bottom electrode 114. In some embodiments, the fifth width W5 is a maximum width of the bottom electrode 114. In some embodiments, the fifth width W5 may range from approximately 20 nanometers to approximately 150 nanometers, from approximately 34 nanometers to approximately 114 nanometers, from approximately 50 nanometers to approximately 100 nanometers, or other similar values. In some embodiments, the BEVA 112 is above a topmost surface of the conductive barrier layer 108.

A bottommost surface of the etch stop layer 204 is disposed below a topmost surface of the ILD layer 104 by a distance D1. Further, a top surface of the interconnect structure 106 is the distance D1 above an upper surface of the ILD layer 104 located laterally outside of the conductive barrier layer 108. In some embodiments, inner sidewalls of the etch stop layer 204 contact outer sidewalls of the ILD layer 104. In some embodiments, the distance D1 may range from approximately 5 nanometers to approximately 15 nanometers, from approximately 2 nanometers to approximately 20 nanometers, or other similar values. The conductive barrier layer has a first height H1. In some embodiments, the first height H1 may range from 3 nanometers to 15 nanometers. The BEVA 112 has a second height H2. In some embodiments, the second height H2 may range from approximately 30 nanometers to approximately 80 nanometers, from approximately 30 nanometers to approximately 100 nanometers, from approximately 20 nanometers to approximately 150 nanometers, or other similar values. Based on the distance D1 and the first height H1, a first upper surface of the etch stop layer 204 located above the conductive barrier layer 108 may be above a second upper surface of the etch stop layer 204 contacting the sidewall spacer 208.

In some embodiments, the etch stop layer 204 continuously extends from over the conductive barrier layer 108 to below the conductive barrier layer 108. In some embodiments, the etch stop layer 204 shares a curved sidewall with the dielectric layer 110. In some embodiments, the ILD layer 104 is laterally between outermost sidewalls of the interconnect structure 106 and the sidewall spacer 208. In some embodiments, a bottom surface of the data storage structure 116 continuously extends past the opposing outermost sidewalls of the BEVA 112. In some embodiments, outer sidewalls of the sidewall spacer 208 may be slanted at a first angle A1 of other than 90 degrees with respect to a top surface of the ILD layer 104. In some embodiments, sidewalls of the dielectric layer 110 may be slanted at a second angle A2 of other than 90 degrees with respect to a top surface of the ILD layer 104. In some embodiments, the first angle A1 may be different than the second angle A2. In further embodiments, the second angle A2 may be greater than the first angle A1.

Figure 3:
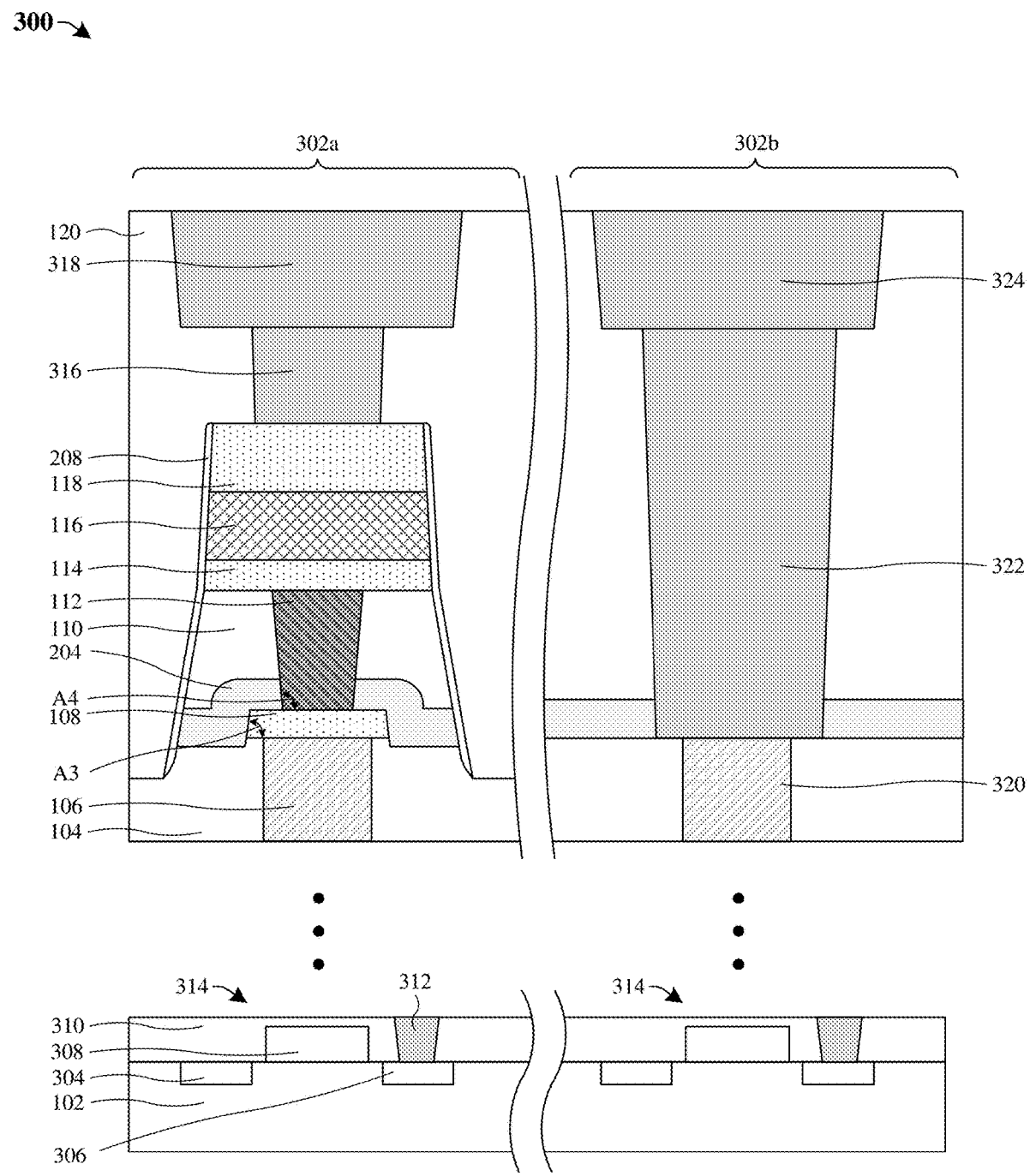
FIG. 3 illustrates a cross-sectional view of some embodiments of an integrated chip (IC) comprising a bottom electrode via (BEVA) having a narrow width that is configured to reduce shorting due to re-deposition of a conductive material during manufacturing.

FIG. 3 illustrates a cross-sectional view 300 of some embodiments of an integrated chip (IC) comprising a bottom electrode via (BEVA) having a narrow width that is configured to reduce shorting due to re-deposition of a conductive material during manufacturing.

The IC comprises a memory cell region 302a and a logic region 302b. Both the memory cell region 302a and the logic region 302b comprise a transistor structure 314 disposed in a semiconductor substrate 102. In various embodiments, the transistor structure 314 may comprise a field effect transistor (FET), a planar FET, a finFET, a gate all around structure (GAA) transistor, or the like. The transistor structure 314 comprises heavily doped regions such as a source 304 and a drain 306 disposed within the semiconductor substrate 102. A gate structure 308 is disposed over a top surface of the semiconductor substrate 102 and between the source 304 and the drain 306. A lower inter-layer dielectric (ILD) layer 310 is disposed over the semiconductor substrate 102 and surrounding outer sidewalls of the gate structure 308. A contact plug 312 is disposed within the lower ILD layer 310. In some embodiments, the contact plug 312 is electrically coupled to the transistor structure 314. In further embodiments, the contact plug 312 may be electrically coupled to the drain 306. In some embodiments, the gate structure 308 may comprise a conductive gate electrode that is separated from the semiconductor substrate 102 by a gate dielectric layer (not shown).

The memory cell region 302a comprises an ILD layer 104 overlying the lower ILD layer 310. The ILD layer 104 surrounds an interconnect structure 106. In some embodiments, the interconnect structure 106 is electrically coupled to the transistor structure 314 of the memory cell region 302a. A conductive barrier layer 108 overlies the interconnect structure 106 and comprises one or more outer sidewalls that are laterally outside of outer sidewalls of the interconnect structure 106. A bottom electrode via (BEVA) 112 extends through an opening 103 defined by inner sidewalls of the dielectric layer 110 and inner sidewalls of the etch stop layer 204. In some embodiments, the outer sidewalls of the conductive barrier layer 108 are slanted at a third angle A3. In some embodiments, the third angle A3 may be an acute angle as measured through the conductive barrier layer 108 and with respect to a bottom surface of the conductive barrier layer 108. In some embodiments, the BEVA 112 may comprise opposing outer sidewalls tilted at a fourth angle A4. In some embodiments, the fourth angle A4 may range from approximately 90 degrees to approximately 120 degrees, from approximately 85 degrees to approximately 135 degrees, or other similar values as measured through the BEVA 112 and with respect to a top surface of the conductive barrier layer 108. In some embodiments, the conductive barrier layer 108 has a maximum width at a bottom surface of the conductive barrier layer 108. An etch stop layer 204 overlies the conductive barrier layer 108. A dielectric layer 110 is disposed over the etch stop layer 204.

A bottom electrode 114 contacts a top surface of the BEVA 112. A data storage structure 116 overlies the bottom electrode 114, and a top electrode 118 overlies the data storage structure 116. A sidewall spacer 208 is disposed along sidewalls of the data storage structure 116, sidewalls of the top electrode 118, and sidewalls of the bottom electrode 114. In some embodiments, the sidewall spacer 208 is further disposed along sidewalls of the dielectric layer 110, sidewalls of the etch stop layer 204, and sidewalls of the ILD layer 104. A dielectric structure 120 overlies the top electrode 118 and surrounds outer sidewalls of the top electrode 118. A top electrode via (TEVA) 316 overlies the top electrode 118 and electrically couples the top electrode 118 to a first overlying interconnect structure 318. In some embodiments, the TEVA 316 is narrower than the top electrode 118. In some embodiments, a bottom surface of the first overlying interconnect structure 318 overlies the TEVA 316 and extends laterally past opposing sidewalls of the TEVA 316.

The logic region 302b comprises an underlying interconnect structure 320 disposed within the ILD layer 104. In some embodiments, the underlying interconnect structure 320 is electrically coupled to transistor structure 314 of the logic region 302b. The etch stop layer 204 overlies the underlying interconnect structure 320. In some embodiments, outer sidewalls of the underlying interconnect structure 320 are laterally between inner sidewalls of the etch stop layer 204. An inter-tier interconnect structure 322 is disposed within the dielectric structure 120, and electrically couples the underlying interconnect structure 320 to a second overlying interconnect structure 324. In some embodiments, the inter-tier interconnect structure 322 has a maximum width at a top surface of the inter-tier interconnect structure 322.

In some embodiments, the contact plug 312, the TEVA 316, the first overlying interconnect structure 318, the underlying interconnect structure 320, the inter-tier interconnect structure 322, and the second overlying interconnect structure 324 are conductive and may be or otherwise comprise, for example, tungsten, aluminum copper, copper, aluminum, some other suitable metal(s), or some other suitable conductive material(s). The lower ILD layer 310 may be or otherwise comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable material(s). The gate structure 308 may be or otherwise comprise, for example, doped polysilicon, metal, or some other suitable conductive material(s).

In some embodiments, the conductive barrier layer 108 may be or otherwise comprise, for example, tantalum, tantalum nitride, titanium, titanium nitride, tungsten carbide, or some other suitable material(s). In some embodiments, the BEVA 112 may comprise a conductive material having a relatively low diffusivity (e.g., less than or equal to approximately $10^{-9}$ cm$^2$/s, less than or equal to approximately $10^{-10}$ cm$^2$/s, less than or equal to approximately $10^{-11}$ cm$^2$/s, or other similar values) and a relatively low resistivity (e.g., less than or equal to approximately 15 μ(micron)-Ohm-cm, less than or equal to approximately 10μ-Ohm-cm, less than or equal to approximately 5μ-Ohm-cm, or other similar values). In various embodiments, the conductive material of the BEVA 112 may be or otherwise comprise, for example, tungsten, nickel, cobalt, platinum, gold, iron, or the like. The relatively low diffusivity of the conductive material allows for the BEVA 112 to be disposed within the dielectric layer 110 without a surrounding diffusion barrier layer. Having the conductive material of the BEVA without a surrounding diffusion barrier layer allows for the conductive material to have a relatively wide width that provides for a good resistance, while still being covered by the dielectric layer 110 to protect from re-deposition during manufacturing. Therefore, having the BEVA comprise a conductive material that has both a low resistivity and a low diffusivity allows for the BEVA of the disclosed IC to have a resistance that may be lower than that of a conventional BEVA.

Figure 4:
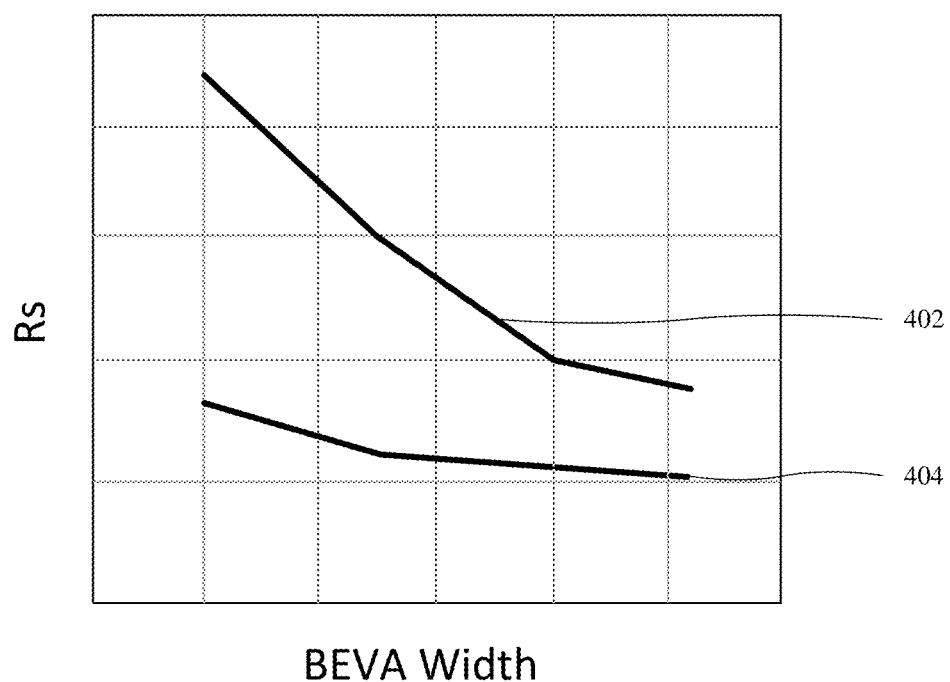
FIG. 4 illustrates a graphical representation of an exemplary relationship between resistance and bottom electrode via (BEVA) width in an integrated circuit (IC).

For example, FIG. 4 illustrates a graphical representation 400 of an exemplary relationship between resistance and bottom electrode via (BEVA) width in an integrated circuit (IC). The IC may be, for example, the IC of FIG. 1.

A first line 402 represents a conventional BEVA with a first height and a first resistivity. A second line 404 represents a disclosed BEVA with a second height and a second resistivity. The first height larger than the second height, and the first resistivity larger than the second resistivity. The x-axis represents a resistance of the BEVA, while the Y axis represents a width of the BEVA. As shown in FIG. 4, despite using a smaller BEVA width, the disclosed BEVA still has a lower resistance than a conventional BEVA due to a small height of the BEVA and the low resistivity and diffusivity of the BEVA. Thus, by using a shorter, low-resistivity BEVA, a narrower BEVA can be implemented, ensuring that during an etch of the data storage structure, no metallic by-product from the BEVA can be re-deposited on sidewalls of the data storage structure, while still minimizing power consumption impact of high resistance.

With reference to FIGS. 5-18, a series of cross sections 500-1800 illustrate some embodiments of a method for forming an integrated chip (IC) comprising a plurality of memory regions with a bottom electrode via (BEVA) having a narrow width that is configured to reduce shorting due to re-deposition of a conductive material during manufacturing. Although FIGS. 5-18 are described in relation to a method, it will be appreciated that the structures disclosed in FIGS. 5-18 are not limited to such a method, but instead may stand alone as structures independent of the method.

Figure 5:
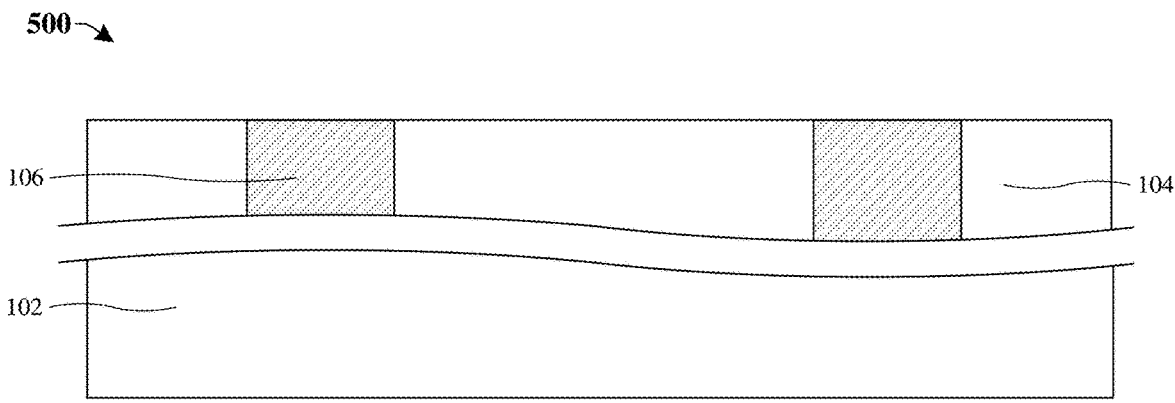
FIGS. 5-18 illustrate a series of cross-sectional views for some embodiments of a method of forming an IC comprising a plurality of memory regions with a bottom electrode via (BEVA) having a narrow width that is configured to reduce shorting due to re-deposition of a conductive material during manufacturing.

As illustrated by the cross-sectional view 500 of FIG. 5, an interconnect structure 106 is formed within an inter-layer dielectric (ILD) layer 104 over a semiconductor substrate 102. In some embodiments, the semiconductor substrate 102 may be or otherwise comprise, for example, a bulk silicon substrate, a bulk germanium substrate, a group III-V substrate, or some other suitable semiconductor substrate. In some embodiments, the ILD layer 104 may be or otherwise comprise, for example, nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or some other suitable material(s). In some embodiments, the interconnect structure 106 is conductive and may be or otherwise comprise, for example, tungsten, aluminum copper, copper, aluminum, some other suitable metal(s), or some other suitable conductive material(s).

In some embodiments, the ILD layer 104 may be formed by way of a deposition process (e.g., a chemical vapor deposition (CVD) process, a plasma enhanced CVD process, a physical vapor deposition process, or the like). In some embodiments, the interconnect structure 106 may be formed by way of a damascene process (e.g., a single damascene process, a dual damascene process), in which the ILD layer 104 is selectively patterned to form an opening that is subsequently filled with a conductive material.

Figure 6:
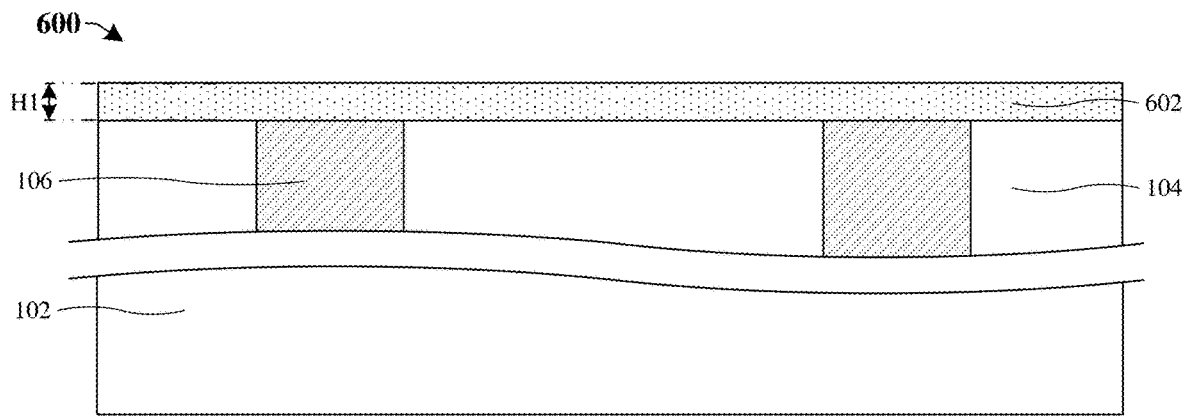

As illustrated by the cross-sectional view 600 of FIG. 6, a conductive barrier structure 602 is formed over the ILD layer 104. In some embodiments, the conductive barrier layer 108 may be formed to a height H1. In various embodiments, the height H1 may be between approximately 3 nm and approximately 15 nm, between approximately 5 nm and approximately 30 nm, or other similar values. In some embodiments, the conductive barrier structure 602 may be formed by way of a deposition process (e.g., a chemical vapor deposition (CVD) process, a plasma enhanced CVD process, a physical vapor deposition process, or the like). In some embodiments, the conductive barrier structure 602 may be or otherwise comprise, for example, tantalum, tantalum nitride, titanium, titanium nitride, tungsten carbide, or some other suitable material(s).

Figure 7:
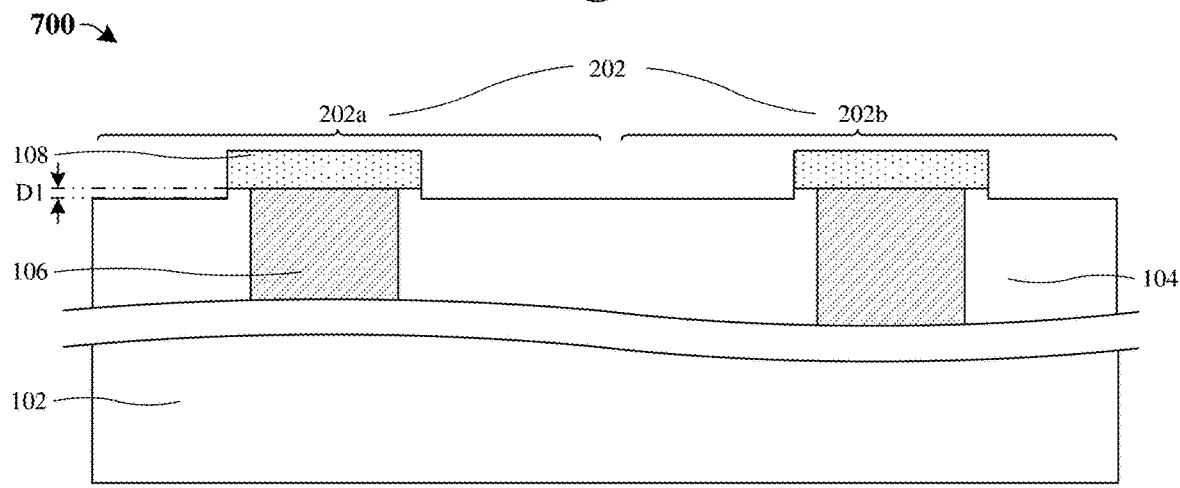

As illustrated by the cross-sectional view 700 of FIG. 7, the conductive barrier structure 602 is patterned by a first etching process to form a conductive barrier layer 108 in respective ones of a plurality of memory regions 202, such that a first memory region 202a and a second memory region 202b respectively comprise a conductive barrier layer 108 overlying respective portions of the interconnect structure 106. The first etching process may be or otherwise comprise, for example, a wet etching process, or a dry etching process. In various embodiments, the wet etching process may utilize a wet etchant comprising hydrofluoric acid (HF), potassium hydroxide (KOH), an alkali wet etchant, or the like. In some embodiments, the dry etching process may utilize a dry etchant comprising a plasma etchant, an ion bombardment etchant, or the like. In some embodiments, the first etching process removes a portion of the ILD layer 104 such that the ILD layer 104 that is directly below the conductive barrier layer 108 protrudes outward from an upper surface of the ILD layer 104 by a distance D1 after the first etching process is completed. In some embodiments, the distance D1 may range from approximately 5 nanometers to approximately 15 nanometers, from approximately 2 nanometers to approximately 20 nanometers, or other similar values.

Figure 8:
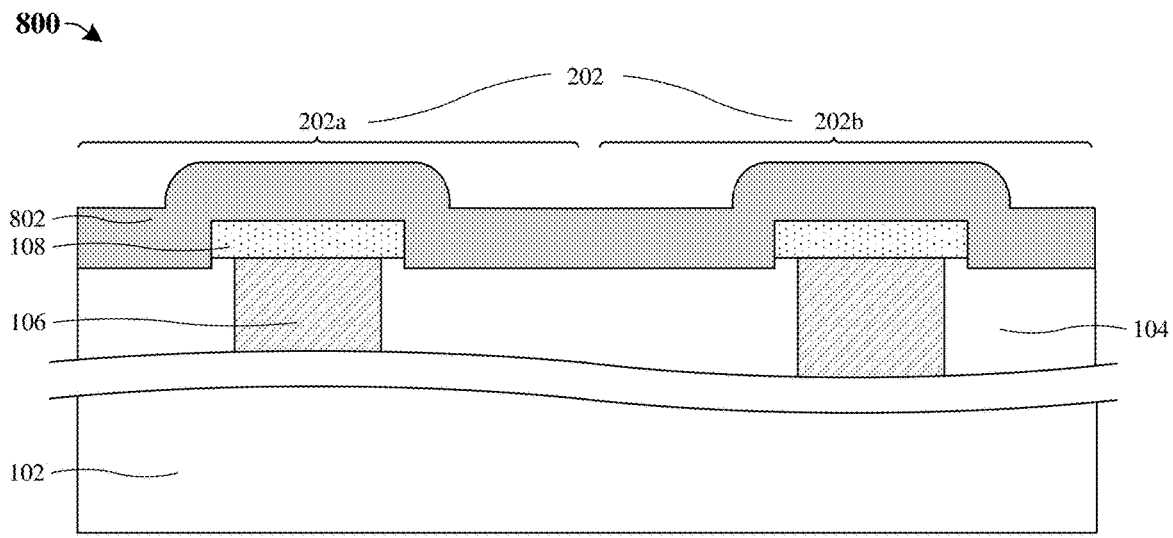

As illustrated by the cross-sectional view 800 of FIG. 8, an etch stop structure 802 is formed over the ILD layer 104 and the conductive barrier layer 108. The etch stop structure 802 may be formed to have a thickness ranging from 10 nanometers to 40 nanometers. The etch stop structure 802 may be formed by way of a deposition process (e.g., a chemical vapor deposition (CVD) process, a plasma enhanced CVD process, a physical vapor deposition process, or the like). In some embodiments, the etch stop structure 802 may be or otherwise comprise, for example, silicon dioxide, a nitride (e.g., silicon nitride, silicon oxynitride), a carbide (e.g., silicon carbide, silicon oxycarbide), some other suitable etch stop material(s), or a combination of the aforementioned materials.

Figure 9:
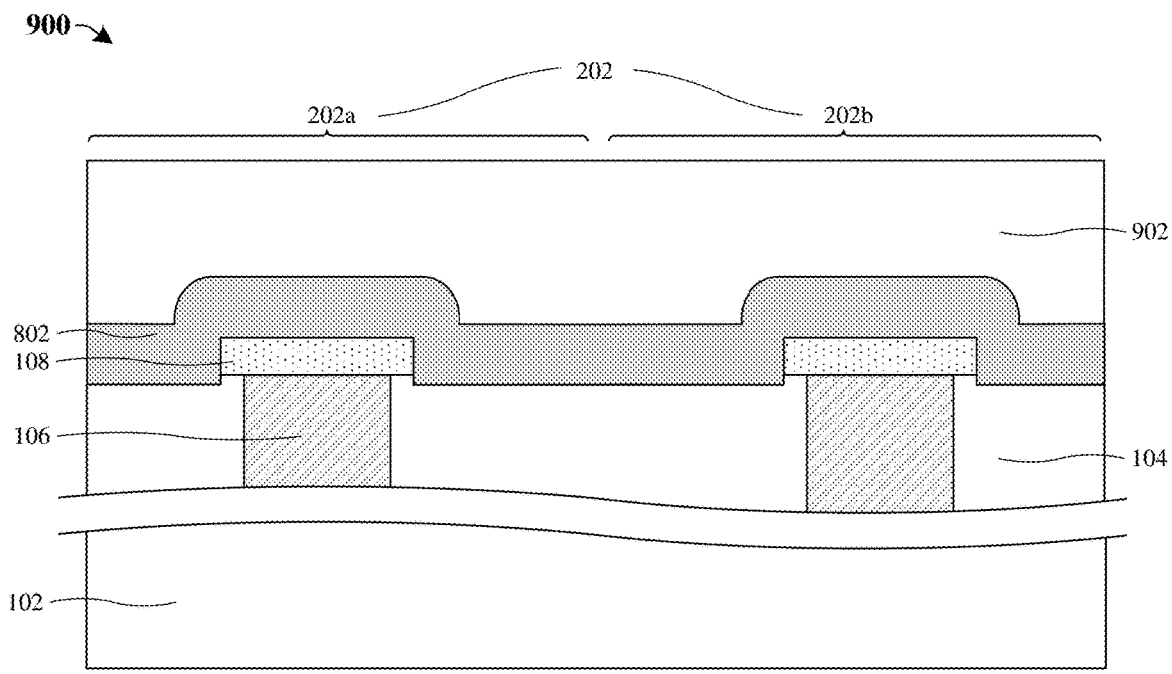

As illustrated by the cross-sectional view 900 of FIG. 9, a dielectric material 902 is formed over the etch stop structure 802. The dielectric material 902 may be formed by way of a deposition process (e.g., a chemical vapor deposition (CVD) process, a plasma enhanced CVD process, a physical vapor deposition process, or the like). In some embodiments, the dielectric material 902 may be or otherwise comprise, for example, silicon dioxide, silicon nitride, some other suitable low-k dielectric(s), or any combination of the foregoing.

Figure 10:
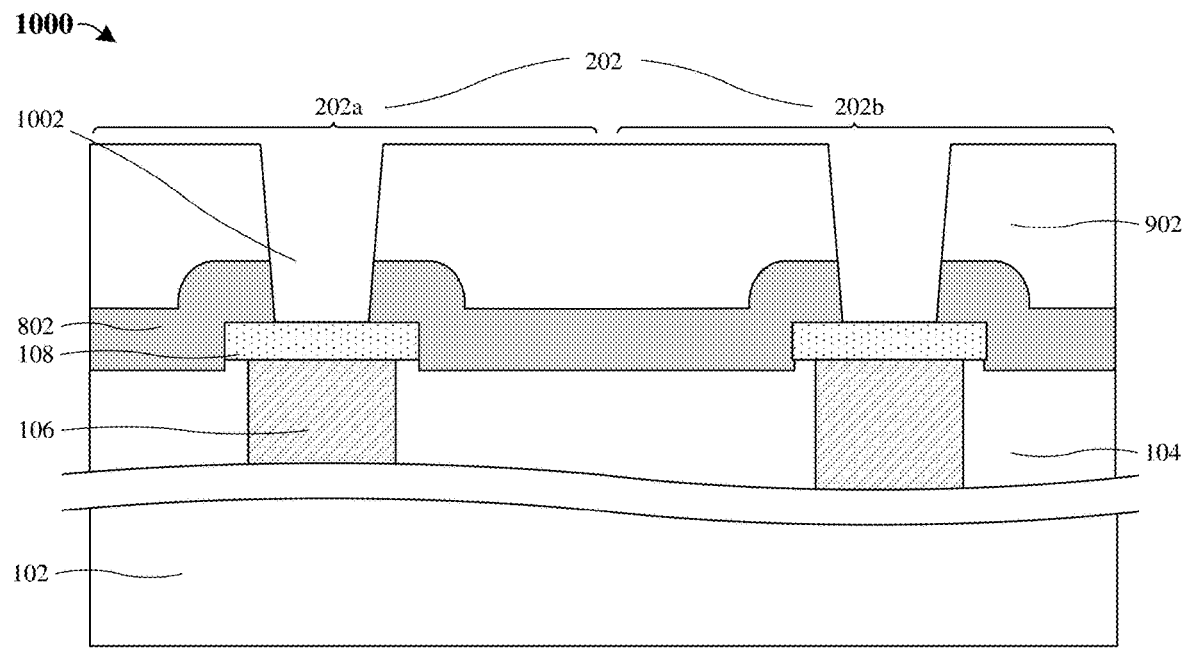

As illustrated by the cross-sectional view 1000 of FIG. 10, a hole 1002 is etched in the dielectric material 902 and the etch stop structure 802 over the conductive barrier layer 108 by a second etching process. In some embodiments, the hole 1002 is etched into respective ones of the plurality of memory regions 202. In some embodiments (not shown), the second etching process may be performed by forming a mask (e.g., a hard mask, a photoresist, or the like) over the dielectric material 902, then exposing the dielectric material 902 to an etchant according to the mask to form the hole 1002. The mask is then removed after performing the second etching process.

Figure 11:
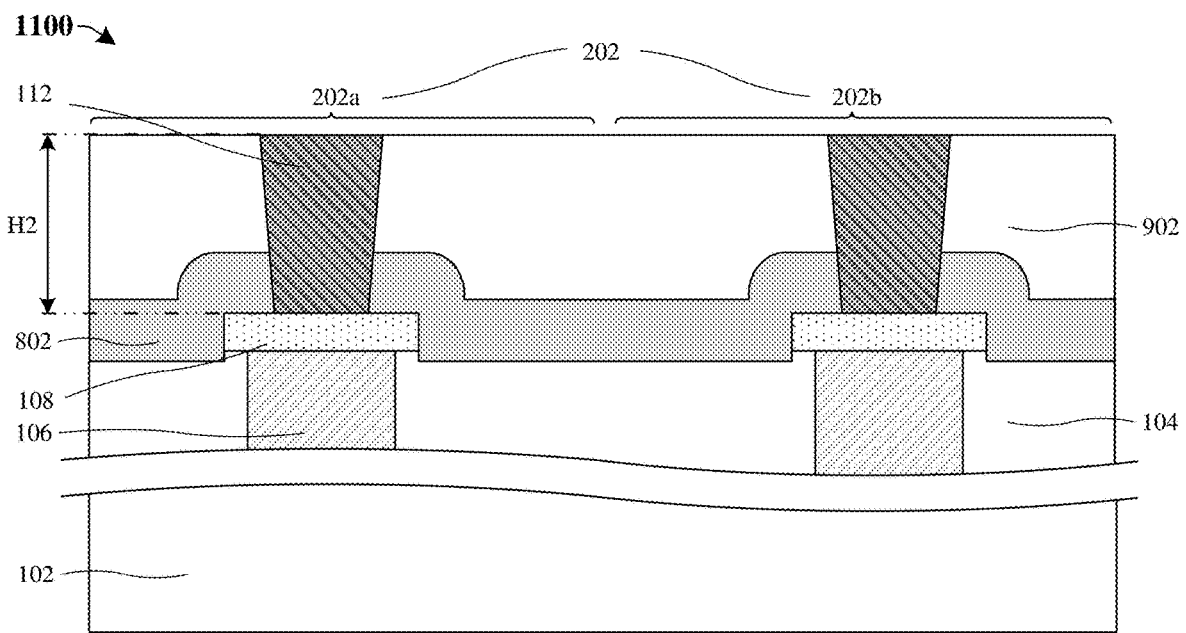

As illustrated by the cross-sectional view 1100 of FIG. 11, a bottom electrode via (BEVA) 112 is formed in the hole 1002. In some embodiments, the BEVA 112 is formed by depositing a conductive material within respective ones of the plurality of memory regions 202. A planarization process is subsequently performed to remove the conductive material from over a top surface of the dielectric material 902 to form the BEVA 112. The BEVA 112 has a second height H2. In some embodiments, the second height H2 may range from approximately 30 nanometers to approximately 80 nanometers, from approximately 30 nanometers to approximately 100 nanometers, from approximately 20 nanometers to approximately 150 nanometers, or other similar values. The planarization process may be or otherwise comprise, for example, a chemical-mechanical planarization (CMP), grinding, an etch, or some other suitable process. In various embodiments, the conductive material may be deposited by a deposition process that may be or otherwise comprise, for example, chemical vapor deposition, physical vapor deposition, sputtering, and/or a plating process (e.g., an electroplating process, an electro-less plating process). In some embodiments, the conductive material may be or otherwise comprise, for example, tungsten, nickel, cobalt, platinum, gold, iron, or some other suitable low resistivity and slow diffusivity conductive material(s).

Figure 12:
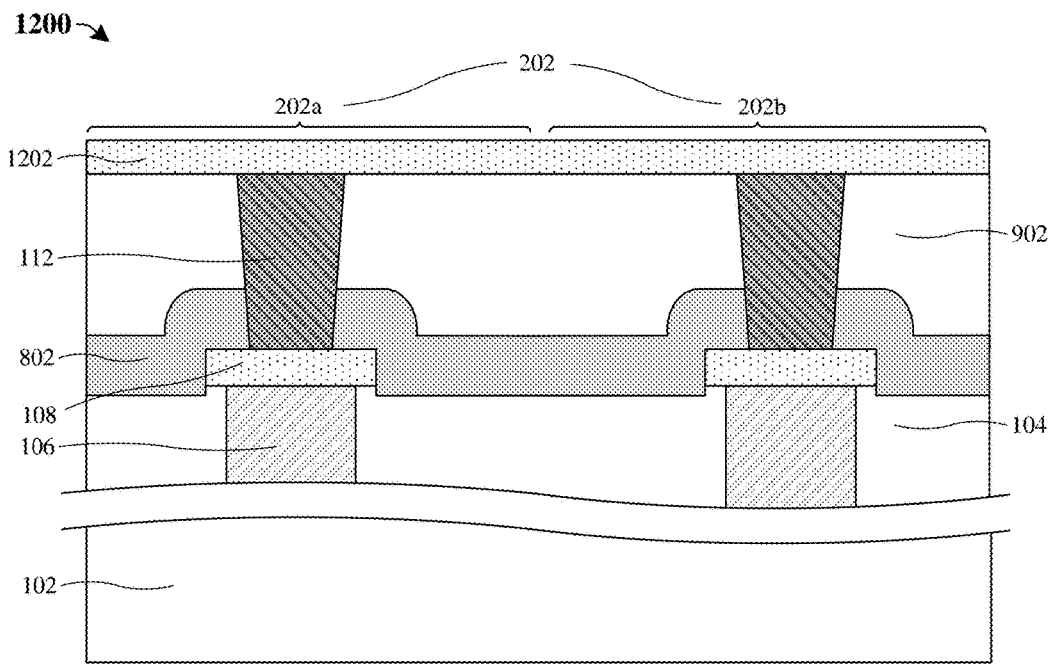

As illustrated by the cross-sectional view 1200 of FIG. 12, a bottom electrode structure 1202 is formed over the dielectric material 902 and the BEVA 112, such that the bottom electrode structure 1202 continuously extends to respective ones of the plurality of memory regions 202. In some embodiments, the bottom electrode may have a thickness ranging from approximately 5 nanometers to approximately 30 nanometers, from approximately 10 nanometers to approximately 45 nanometers, or other similar values. The bottom electrode structure 1202 may be or otherwise comprise, for example, tantalum, titanium, tungsten, titanium nitride, tantalum nitride, or the like. The bottom electrode structure 1202 may be formed by, for example, chemical vapor deposition, physical vapor deposition, sputtering, and/or a plating process (e.g., an electroplating process, an electro-less plating process).

Figure 13:
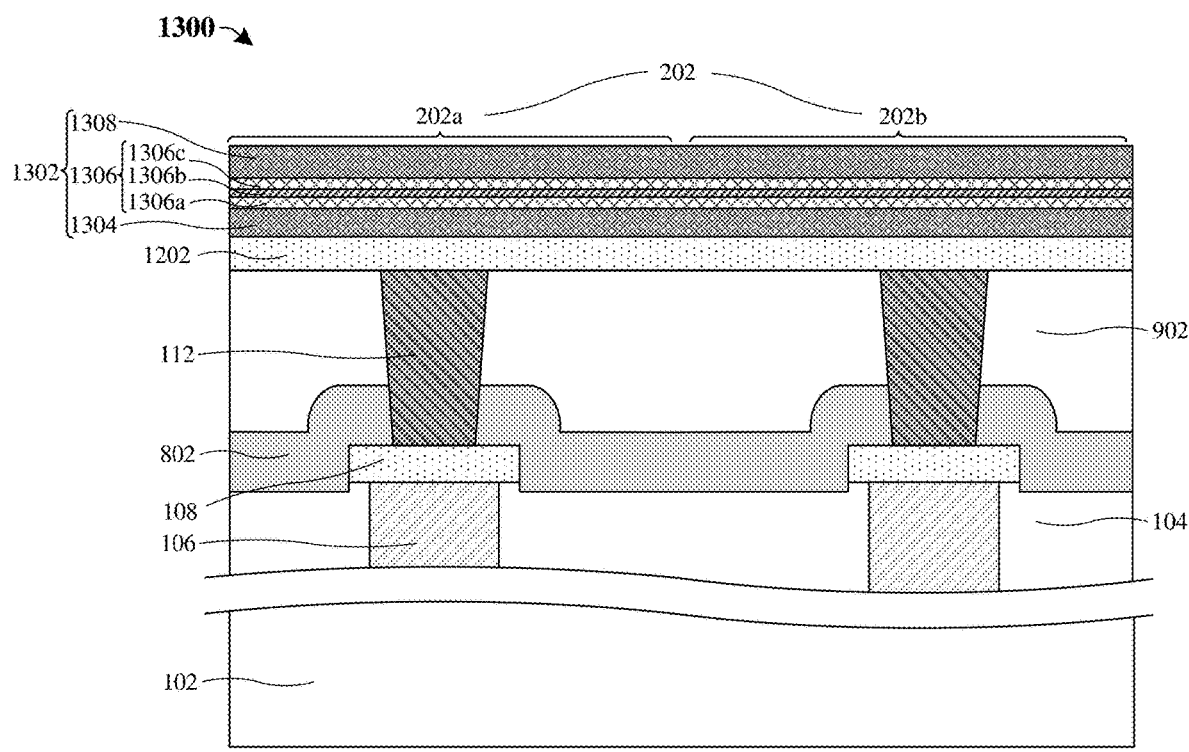

As illustrated by the cross-sectional view 1300 of FIG. 13, a data storage element 1302 is formed over the bottom electrode structure 1202, such that the data storage element 1302 continuously extends to respective ones of the plurality of memory regions 202. In some embodiments, forming the data storage element 1302 comprises forming a seed structure 1304 over the bottom electrode structure 1202, forming a MTJ structure 1306 over the seed structure 1304, and forming an encapsulation structure 1308 over the MTJ structure 1306. In further embodiments, forming the MTJ structure 1306 comprises forming a pinned ferromagnetic structure 1306a over the seed structure 1304, forming a tunnel dielectric structure 1306b over the pinned ferromagnetic structure 1306a, and forming a free ferromagnetic structure 1306c over the tunnel dielectric structure 1306b. The free ferromagnetic structure 1306c and the pinned ferromagnetic structure 1306a may be or otherwise comprise, for example, a cobalt-iron-boron alloy, a cobalt-iron alloy, a nickel-iron alloy, or any suitable ferromagnetic material(s). The tunnel dielectric structure 1306b may be or otherwise comprise, for example, magnesium oxide, another suitable oxide, or any suitable dielectric material(s). The seed structure 1304 may be or otherwise comprise, for example, tantalum nitride, magnesium, cobalt, nickel, chromium, platinum, manganese, some other suitable material(s), or a combination of the foregoing. The encapsulation structure 1308 may be or otherwise comprise, for example, ruthenium, molybdenum, cobalt, iron, boron, magnesium, magnesium oxide, some other suitable material(s), or a combination of the foregoing. The seed structure 1304, the encapsulation structure 1308, the free ferromagnetic structure 1306c, the tunnel dielectric structure 1306b, and the pinned ferromagnetic structure 1306a may be formed by, for example, deposition processes (e.g., a chemical vapor deposition (CVD) process, a plasma enhanced CVD process, a physical vapor deposition process, or the like).

Figure 14:
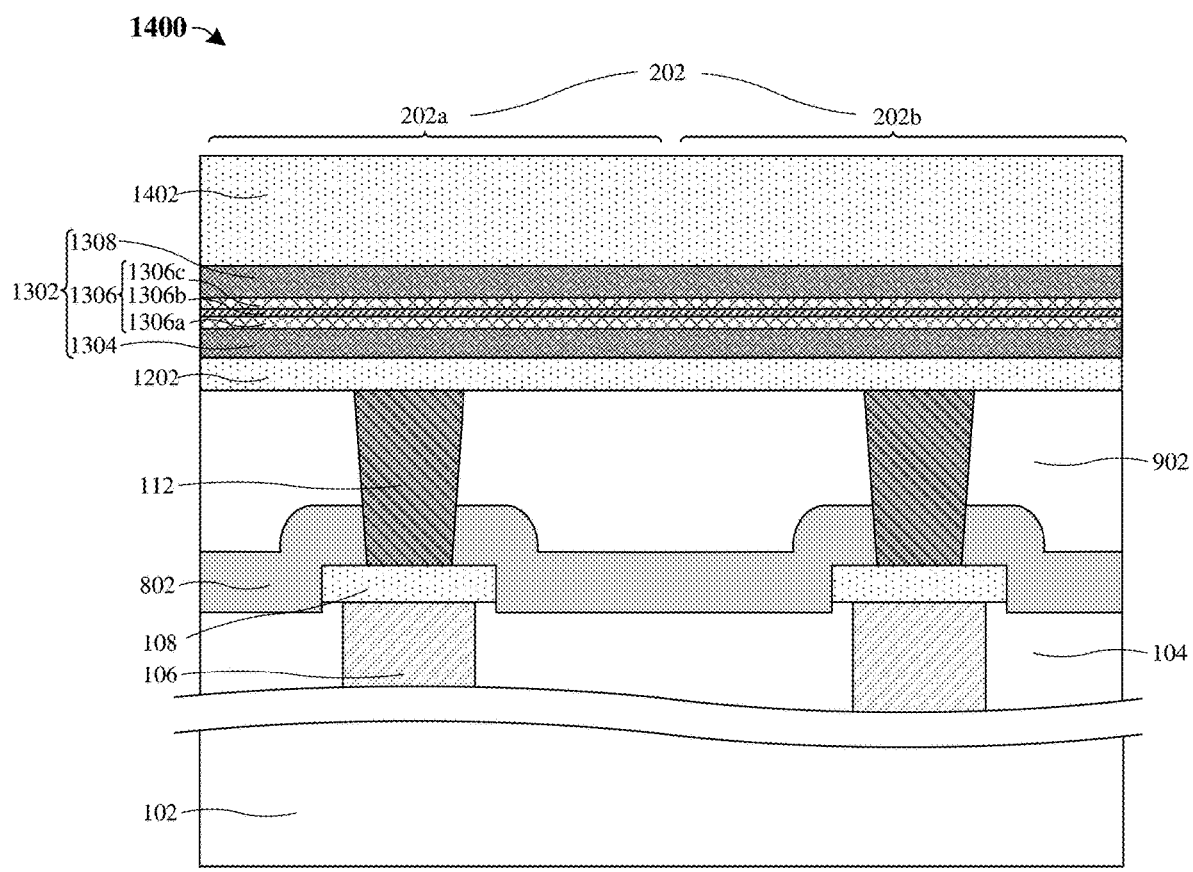

As illustrated by the cross-sectional view 1400 of FIG. 14, a top electrode structure 1402 is formed over the data storage element 1302, such that the top electrode structure 1402 continuously extends to respective ones of the plurality of memory regions 202. In some embodiments, the top electrode structure 1402 may be formed to have a thickness ranging from approximately 15 nanometers to approximately 50 nanometers, from approximately 10 nanometers to approximately 75 nanometers, or other similar values. The top electrode structure 1402 may be or otherwise comprise, for example, tantalum, titanium, tungsten, titanium nitride, tantalum nitride, or the like. The top electrode structure 1402 may be formed by, for example, chemical vapor deposition, physical vapor deposition, sputtering, and/or a plating process (e.g., an electroplating process, an electro-less plating process).

Figure 15:
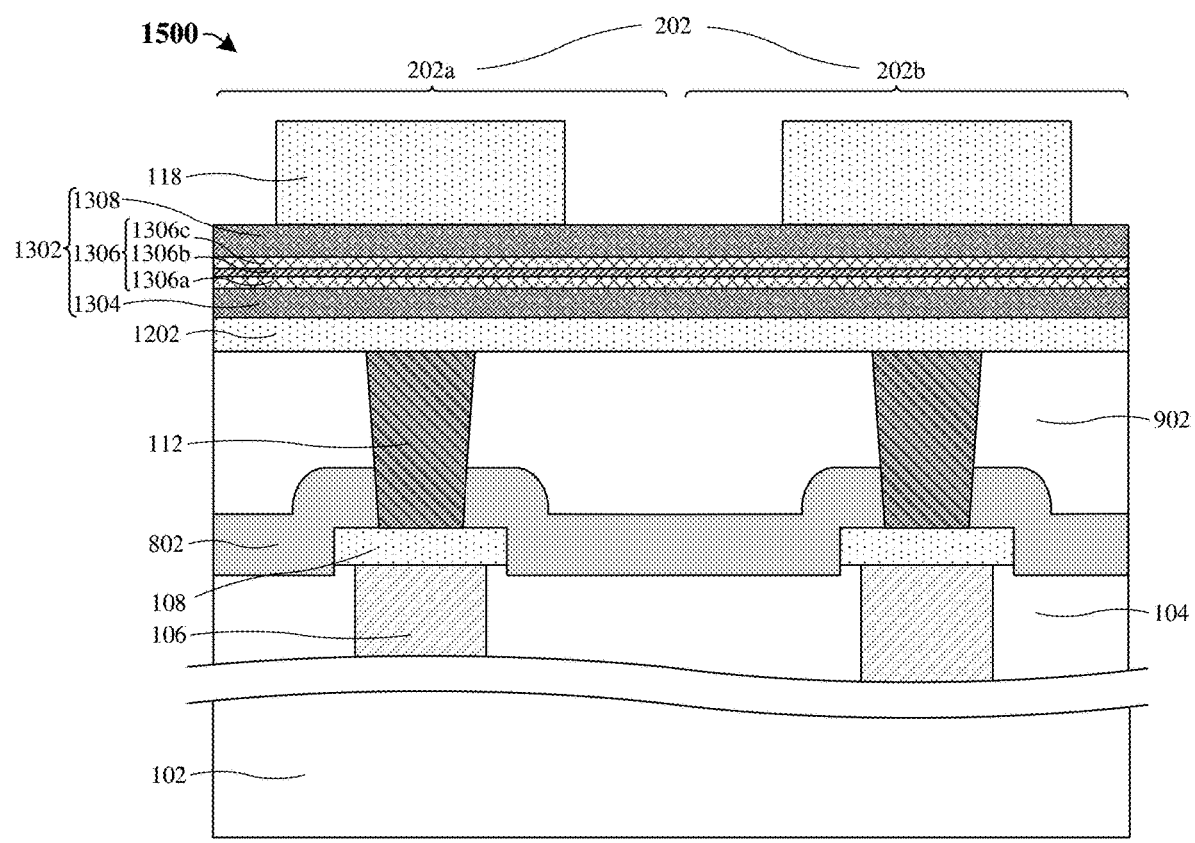

As illustrated by the cross-sectional view 1500 of FIG. 15, the top electrode structure 1402 is patterned by a third etching process. In some embodiments (not shown), the third etching process may be performed by forming a mask (e.g., a hard mask, a photoresist, or the like) over the top electrode structure 1402, then exposing the top electrode structure 1402 to an etchant according to the mask to define a pattern for the top electrode structure 1402. In some embodiments, the top electrode structure 1402 is patterned to form a top electrode 118 in separate portions overlying the BEVA 112 in respective ones of the plurality of memory regions 202. The mask is then removed after performing the third etching process.

Figure 16:
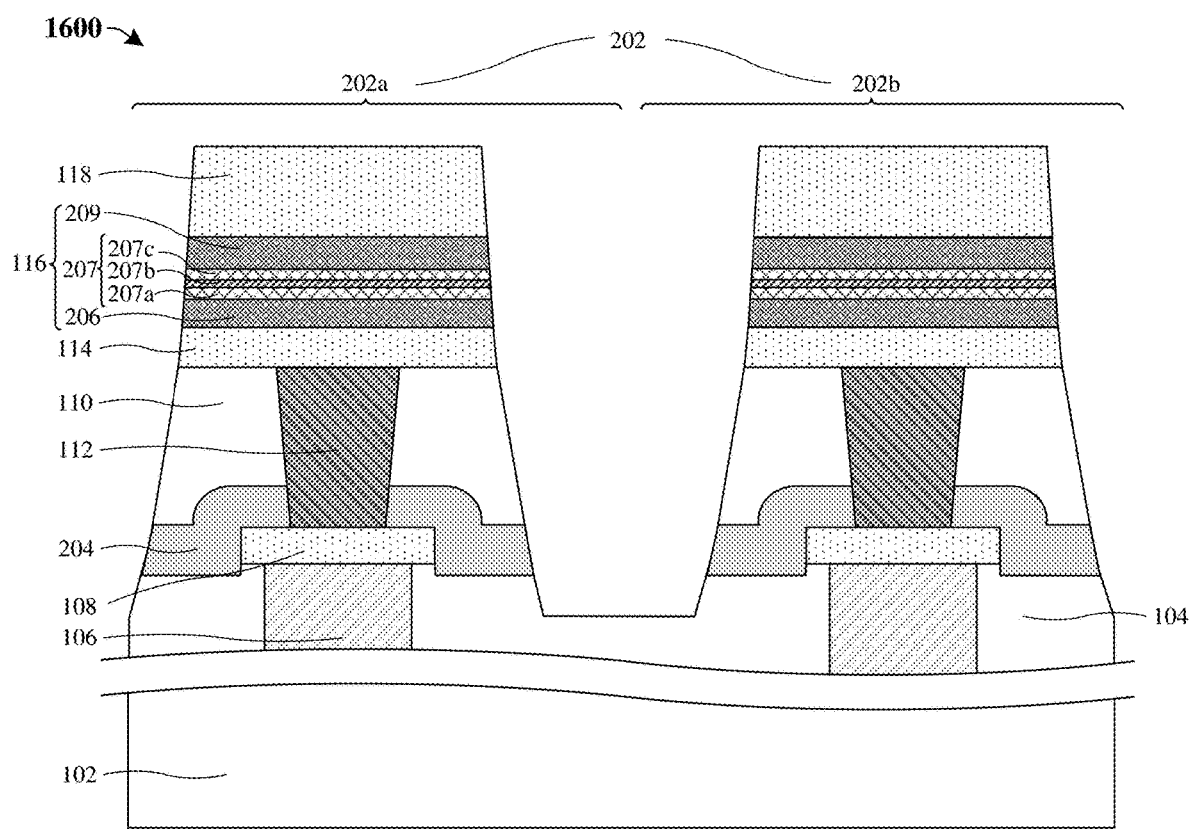

As illustrated by the cross-sectional view 1600 of FIG. 16, the data storage element 1302 and the bottom electrode structure 1202 are patterned by a fourth etching process to respectively form sidewalls of a data storage structure 116 and a bottom electrode 114, such that respective ones of the plurality of memory regions 202 comprise an individual data storage structure 116 and an individual bottom electrode 114. In some embodiments, the fourth etching process further etches the dielectric material 902 and the etch stop structure 802 to respectively form sidewalls of a dielectric layer 110 and an etch stop layer 204, such that respective ones of the plurality of memory regions 202 comprise a dielectric layer 110 and an etch stop layer 204. In further embodiments, the fourth etching process further etches a portion of the ILD layer 104 to form sidewalls of the ILD layer 104 laterally between the first memory region 202a and the second memory region 202b. In some embodiments (not shown), the fourth etching process may be performed by using the top electrode 118 as a hard mask, and exposing the data storage element 1302 to an etchant according to the top electrode 118.

Figure 17:
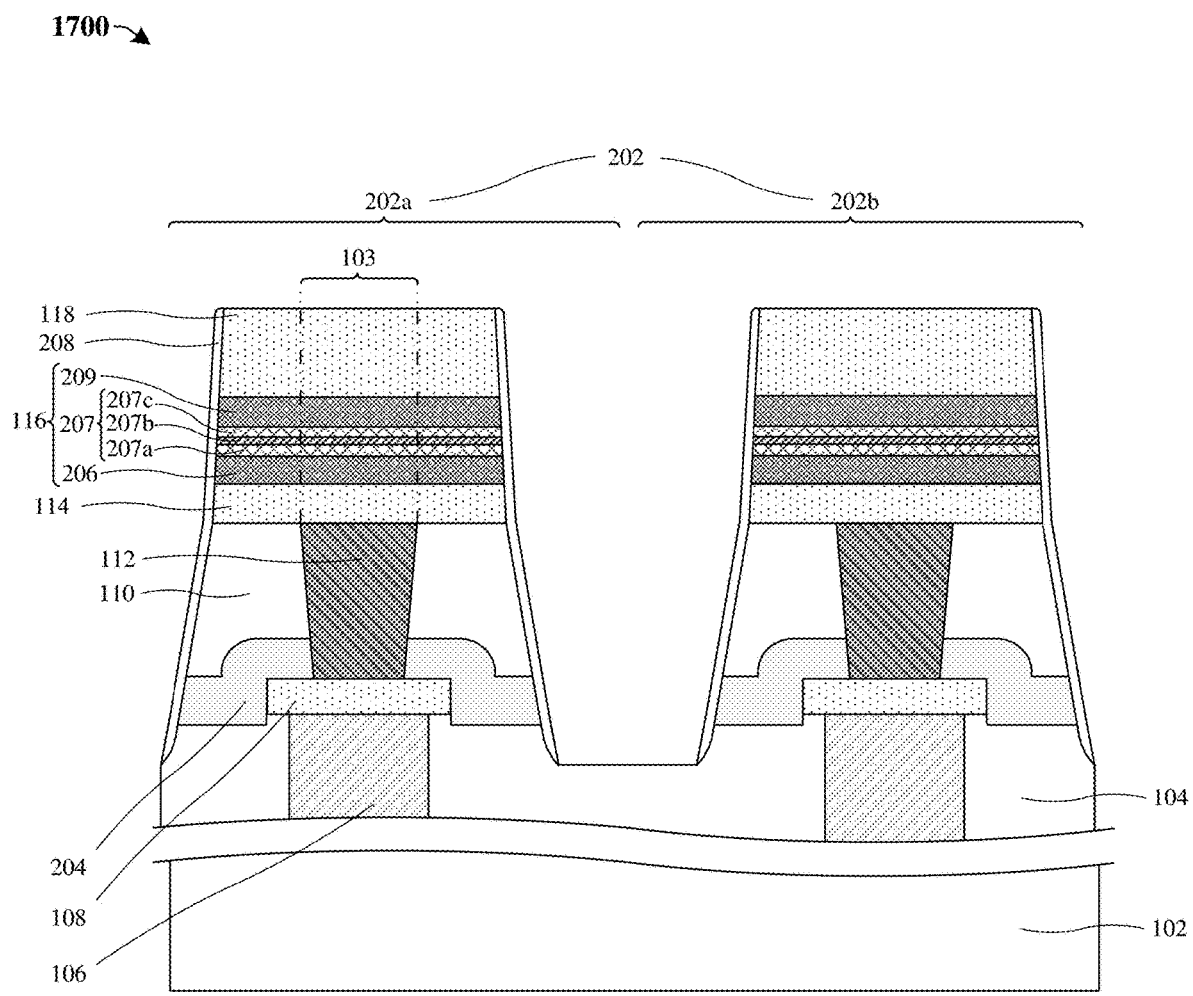

As illustrated by the cross-sectional view 1700 of FIG. 17, a sidewall spacer 208 is formed along the sidewalls of the top electrode 118, the sidewalls of the data storage structure 116, and the sidewalls of the bottom electrode 114 of respective ones of the plurality of memory regions 202. In some embodiments, the sidewall spacer 208 continuously extends along the sidewalls of the dielectric layer 110, the sidewalls of the etch stop layer 204, and the sidewalls of the ILD layer 104 of respective ones of the plurality of memory regions 202. In some embodiments (not shown), laterally extending portions of the sidewall spacer 208 are formed over a top surface of the top electrode 118 and along a top surface of the ILD layer 104. In further embodiments, the laterally extending portions of the sidewall spacer 208 are removed by a removal process. In some embodiments, a portion of the sidewall spacer 208 laterally aligned with the bottom electrode 114 comprises sidewalls tilted at a first angle A1 measured with respect to a top surface of the dielectric layer 110. In further embodiments, a portion of the sidewall spacer 208 laterally aligned with the dielectric layer 110 comprises sidewalls tilted at a second angle A2 different than the first angle A1 measured with respect to a top surface of the ILD layer 104. The sidewall spacer 208 may be or otherwise comprise, for example, silicon dioxide, silicon nitride, titanium nitride, any other suitable material(s), or any combination of the foregoing. The sidewall spacer 208 may be formed by, for example, a deposition process (e.g., a chemical vapor deposition (CVD) process, a plasma enhanced CVD process, a physical vapor deposition process, or the like). The removal process may be or otherwise comprise, for example, a wet etching process. In various embodiments, the wet etching process may utilize a wet etchant comprising hydrofluoric acid (HF), potassium hydroxide (KOH), an alkali wet etchant, or the like.

Figure 18:
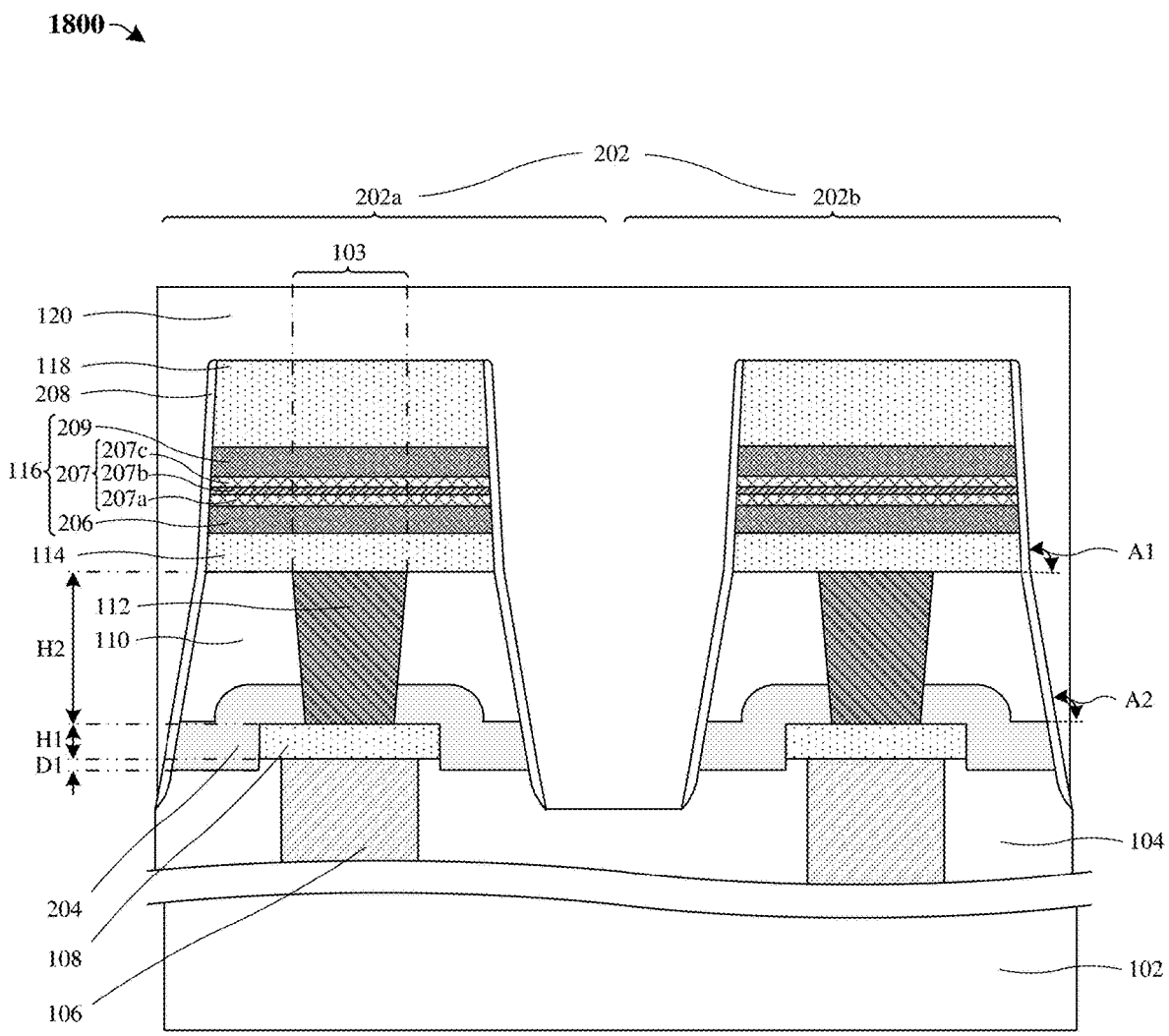

As illustrated by the cross-sectional view 1800 of FIG. 18, a dielectric structure 120 is formed over the top electrode 118. In some embodiments, the dielectric structure 120 continuously extends over both the first memory region 202a and the second memory region 202b. The dielectric structure 120 may be or otherwise comprise, for example, silicon dioxide, silicon nitride, titanium nitride, any other suitable material(s), or any combination of the foregoing. The dielectric structure 120 may be formed by, for example, a deposition process (e.g., a chemical vapor deposition (CVD) process, a plasma enhanced CVD process, a physical vapor deposition process, or the like). The removal process may be or otherwise comprise, for example, a wet etching process.

Figure 19:
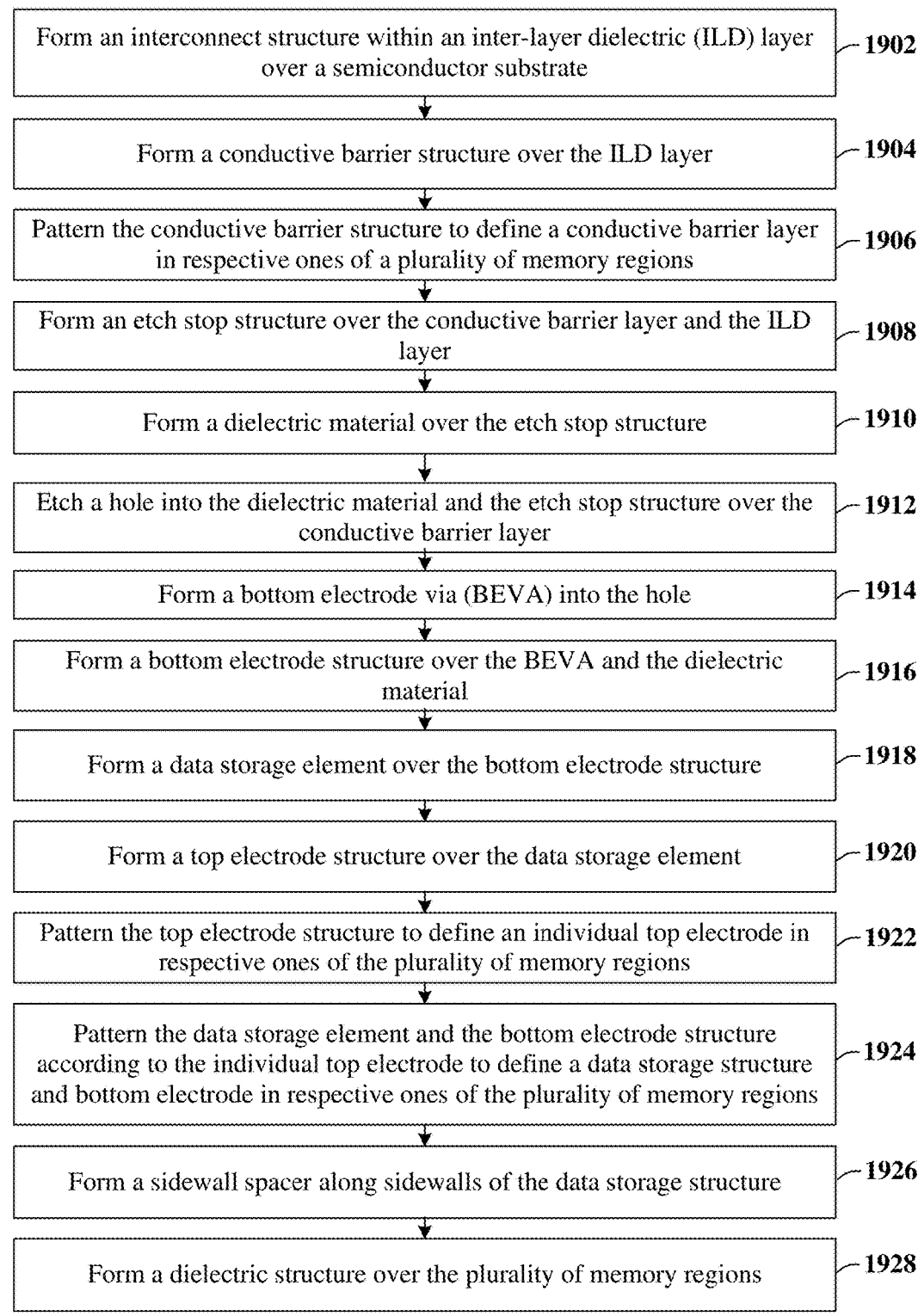
FIG. 19 illustrates a flowchart of some embodiments of a method consistent with FIGS. 5-18.

With respect to FIG. 19, a flowchart 1900 illustrates some embodiments of a method for forming an integrated chip (IC) comprising a plurality of memory regions with a narrow bottom electrode via (BEVA). The method may, for example, correspond to the method of FIGS. 5-18.

While the disclosed flowchart 1900 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 1902, an interconnect structure is formed within an inter-layer dielectric (ILD) layer over a semiconductor substrate. FIG. 5 illustrates a cross-sectional view 500 of some embodiments corresponding to act 1902.

At act 1904, a conductive barrier structure is formed over the ILD layer. FIG. 6 illustrates a cross-sectional view 600 of some embodiments corresponding to act 1904.

At act 1906, the conductive barrier structure is patterned to form a conductive barrier layer in respective ones of a plurality of memory regions. FIG. 7 illustrates a cross-sectional view 700 of some embodiments corresponding to act 1906.

At act 1908, an etch stop structure is formed over the conductive barrier layer and the ILD layer. FIG. 8 illustrates a cross-sectional view 800 of some embodiments corresponding to act 1908.

At act 1910, a dielectric material is formed over the etch stop structure. FIG. 9 illustrates a cross-sectional view 900 of some embodiments corresponding to act 1910.

At act 1912, a hole is etched into the dielectric material and the etch stop structure over the conductive barrier layer. FIG. 10 illustrates a cross-sectional view 1000 of some embodiments corresponding to act 1912.

At act 1914, a bottom electrode via (BEVA) is formed into the hole. FIG. 11 illustrates a cross-sectional view 1100 of some embodiments corresponding to act 1914.

At act 1916, a bottom electrode structure is formed over the BEVA and the dielectric material. FIG. 12 illustrates a cross-sectional view 1200 of some embodiments corresponding to act 1916.

At act 1918, a data storage element is formed over the bottom electrode structure. FIG. 13 illustrates a cross-sectional view 1300 of some embodiments corresponding to act 1918.

At act 1920, a top electrode structure is formed over the data storage element. FIG. 14 illustrates a cross-sectional view 1400 of some embodiments corresponding to act 1920.

At act 1922, the top electrode structure is patterned to form an individual top electrode in respective ones of the plurality of memory regions. FIG. 15 illustrates a cross-sectional view 1500 of some embodiments corresponding to act 1922.

At act 1924, the data storage element and the bottom electrode structure are patterned according to the individual top electrode to form a data storage structure and bottom electrode in respective ones of the plurality of memory regions. FIG. 16 illustrates a cross-sectional view 1600 of some embodiments corresponding to act 1924.

At act 1926, a sidewall spacer is formed along sidewalls of the data storage structure. FIG. 17 illustrates a cross-sectional view 1700 of some embodiments corresponding to act 1926.

At act 1928, a dielectric structure is formed over the plurality of memory regions. FIG. 18 illustrates a cross-sectional view 1800 of some embodiments corresponding to act 1928.

Accordingly, in some embodiments, the present disclosure relates to an integrated chip (IC), comprising a bottom electrode overlying an interconnect structure disposed within a lower inter-level dielectric (ILD) layer, a top electrode over the bottom electrode, a data storage structure between the top electrode from the bottom electrode, a conductive barrier layer directly overlying the interconnect structure, and a bottom electrode via (BEVA) vertically separating and contacting a bottom surface of the bottom electrode and a top surface of the conductive barrier layer, wherein a maximum width of the BEVA is less than a width of the data storage structure.

In other embodiments, the present disclosure relates to a method for forming an integrated chip (IC), comprising forming an interconnect structure within an inter-layer dielectric (ILD) layer, forming a conductive barrier layer over the interconnect structure, forming an dielectric material over the barrier layer, forming a bottom electrode via (BEVA) extending from a top surface of the dielectric material to the barrier layer, forming a bottom electrode structure over the BEVA and the dielectric material, forming an data storage element over the bottom electrode structure, forming a top electrode over the data storage element, and etching the data storage element, the bottom electrode structure, and the dielectric material to respectively form outer sidewalls of a data storage structure, outer sidewalls of a bottom electrode, and outermost sidewalls of a dielectric layer, wherein the dielectric layer separates the BEVA from the outermost sidewalls of the dielectric layer.

In yet other embodiments, the present disclosure relates to an integrated chip (IC) integrated chip (IC), comprising a first metal interconnect structure disposed within a lower dielectric structure, a top electrode vertically stacked over a bottom electrode, a magnetic tunnel junction (MTJ) between the top electrode and the bottom electrode, a conductive barrier layer disposed over the first metal interconnect structure, wherein the first metal interconnect structure is narrower than the conductive barrier layer, an etch stop layer arranged along an upper surface and sidewalls of the conductive barrier layer, and a bottom electrode via (BEVA) between the conductive barrier layer and the bottom electrode, wherein a bottommost surface of the bottom electrode continuously extends past opposing outermost sidewalls of the BEVA.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip (IC), comprising:
a bottom electrode overlying an interconnect structure disposed within a lower inter-level dielectric (ILD) layer;
a top electrode over the bottom electrode;
a data storage structure between the top electrode and the bottom electrode;
a conductive barrier layer having a bottommost surface physically contacting a topmost surface of the interconnect structure, the bottommost surface of the conductive barrier layer laterally extending past opposing outermost sidewalls of the interconnect structure;
a bottom electrode via (BEVA) vertically separating and contacting a bottom surface of the bottom electrode and a top surface of the conductive barrier layer, wherein a maximum width of the BEVA is less than a width of the data storage structure;
an etch stop layer arranged along a topmost surface and outermost sidewalls of the conductive barrier layer;
a dielectric layer disposed between the etch stop layer and the bottom electrode wherein the etch stop layer continuously extends from over the topmost surface of the conductive barrier layer to vertically below the bottommost surface of the conductive barrier layer; and
a sidewall spacer extending along sidewalls of the lower ILD layer, the etch stop layer, the dielectric layer, and the bottom electrode.

2. The IC of claim 1,
wherein the etch stop layer has an upper sidewall arranged along a sidewall of the BEVA and a lower surface arranged on the topmost surface of the conductive barrier layer, wherein the lower surface is vertically below the upper sidewall.

3. The IC of claim 2, wherein the etch stop layer further comprises a lower sidewall contacting both an outermost sidewall of the conductive barrier layer and a sidewall of the lower ILD layer.

4. The IC of claim 1, wherein the etch stop layer has a smaller width than the lower ILD.

5. The IC of claim 1,
wherein the lower ILD layer is laterally between one of the outermost sidewalls of the interconnect structure and the sidewall spacer; and
wherein the dielectric layer is laterally between outermost sidewalls of the BEVA and the sidewall spacer.

6. The IC of claim 1, wherein the conductive barrier layer is arranged over a topmost surface of the lower ILD layer.

7. The IC of claim 1, wherein the BEVA comprises tungsten, nickel, cobalt, platinum, gold, or iron.

8. An integrated chip (IC), comprising:
a first metal interconnect structure disposed within a lower dielectric structure;
a top electrode vertically stacked over a bottom electrode;
a magnetic tunnel junction (MTJ) between the top electrode and the bottom electrode;
a conductive barrier layer disposed over the first metal interconnect structure, wherein the first metal interconnect structure is narrower than the conductive barrier layer;
an etch stop layer arranged over a topmost surface of the conductive barrier layer and along outermost sidewalls of the conductive barrier layer;
a bottom electrode via (BEVA) between the conductive barrier layer and the bottom electrode, wherein a bottommost surface of the bottom electrode continuously extends past opposing outermost sidewalls of the BEVA;
a dielectric layer arranged over the etch stop layer; and
an ILD layer disposed over the lower dielectric structure and laterally surrounding the dielectric layer, wherein the dielectric layer laterally separates the BEVA from the ILD layer and wherein a bottommost surface of the ILD layer is vertically below bottommost surfaces of both the BEVA and the conductive barrier layer.

9. The IC of claim 8, wherein the etch stop layer comprises inner sidewalls that face outer sidewalls of the lower dielectric structure.

10. The IC of claim 8, wherein the BEVA is above the topmost surface of the conductive barrier layer, the topmost surface of the conductive barrier layer laterally extending past the opposing outermost sidewalls of the BEVA.

11. The IC of claim 8, wherein the outermost sidewalls of the conductive barrier layer are tilted such that the topmost surface of the conductive barrier layer is narrower than the bottommost surface of the conductive barrier layer, and wherein outer sidewalls of the BEVA are tilted such that the bottommost surface of the BEVA is narrower than a top surface of the BEVA.

12. An integrated chip (IC), comprising:
a conductive interconnect disposed within a lower inter-level dielectric (ILD) layer;
a conductive barrier disposed over the conductive interconnect;
a bottom electrode structure disposed on the conductive barrier, wherein the bottom electrode structure has one or more sidewalls disposed over a top of the conductive barrier, the conductive barrier laterally extending a non-zero distance past the one or more sidewalls;
a data storage structure disposed on the bottom electrode structure;
a top electrode disposed on the data storage structure; and
an etch stop layer having an interior sidewall that laterally between opposing sides of the etch stop layer, the interior sidewall continuously extending from along an outermost sidewall of the conductive barrier to along a sidewall of the lower ILD layer, wherein the etch stop layer vertically extends from over a topmost surface of the conductive barrier to below a bottommost surface of the conductive barrier.

13. The IC of claim 12, wherein the bottom electrode structure comprises:
a bottom electrode via disposed on the conductive barrier; and
a bottom electrode disposed on the bottom electrode via, wherein the bottom electrode laterally extends past the bottom electrode via in opposing directions.

14. The IC of claim 12, wherein the conductive barrier comprises outermost sidewalls that are aligned with sidewalls of the lower ILD layer.

15. The IC of claim 12,
wherein the etch stop layer has an upper sidewall arranged along the one or more sidewalls of the bottom electrode structure and a lower surface arranged on the topmost surface of the conductive barrier, the upper sidewall and the lower surface being vertically above the interior sidewall.

16. The IC of claim 12, wherein the lower ILD layer covers peripheral regions of a lower surface of the conductive barrier.

17. The IC of claim 12, wherein the topmost surface of the conductive barrier continuously extends from directly below the bottom electrode structure to laterally outside of the bottom electrode structure.

18. The IC of claim 12, wherein the bottom electrode structure contacts the topmost surface of the conductive barrier, the topmost surface of the conductive barrier continuously extending between opposing outermost sidewalls of the conductive barrier.

19. The IC of claim 12, wherein the etch stop layer comprises:
- an upper vertically extending sidewall arranged along the one or more sidewalls of the bottom electrode structure; and
- a lower horizontally extending surface arranged below the upper vertically extending sidewall and directly above the topmost surface of the conductive barrier, the upper vertically extending sidewall and the lower horizontally extending surface being vertically above the interior sidewall.

20. The IC of claim 12, wherein an entirety of the conductive barrier is vertically below a bottommost surface of the bottom electrode structure.

* * * * *